United States Patent

Goffaux

[11] 4,410,851
[45] Oct. 18, 1983

[54] METHOD FOR THE DETECTION OF INSUFFICIENT DIELECTRIC STRENGTH OF COIL INSULATION

[75] Inventor: Raoul Goffaux, Mont-sur-Marchienne, Belgium

[73] Assignee: Ateliers de Constructions Electriques de Charleroi, Brussels, Belgium

[21] Appl. No.: 256,127

[22] Filed: Apr. 21, 1981

[30] Foreign Application Priority Data

Apr. 21, 1980 [EP] European Pat. Off. ....... 80 200362.4
Mar. 2, 1981 [EP] European Pat. Off. ....... 81 870015.5

[51] Int. Cl.$^3$ ............................................. G01R 31/12
[52] U.S. Cl. ......................................................... 324/54
[58] Field of Search ............................. 324/54, 51, 52

[56] References Cited

U.S. PATENT DOCUMENTS 2,890,410  6/1959  Holcomb .............................. 324/54
3,967,196  6/1976  Bennett ................................ 324/54

FOREIGN PATENT DOCUMENTS 214520  4/1961  Austria ................................. 324/54
939886  3/1956  Fed. Rep. of Germany ........ 324/54
519649  7/1976  U.S.S.R. .............................. 324/54

OTHER PUBLICATIONS

*Electrical Engineering in Japan*, vol. 93, No. 1, H. Terase and A. Motomura "Development of a New Automatic Insulation Analyzer", pp. 14-22.
Andreas Kelen, "Critical Examination of the Dissipation Factor...", IEEE Trans. Electr. Insul. vol. EI-13, No. 1, pp. 14-24 (1978).
Tor Orbeck, "The Measurement of Partial Discharges in High-Voltage Coils..." ASEA Journal, vol. 40, No. 9, pp. 125-128 (1967).
P. R. Dudukovic, "Prophylaktische Kontrollmessungen an Isolierungssystemem . . . " Elektrie 25, pp. 473-475 (1971).

*Primary Examiner*—Stanley T. Krawczewicz
*Attorney, Agent, or Firm*—Schwartz, Jeffery, Schwaab, Mack, Blumenthal & Koch

[57] ABSTRACT

Apparatus for detection of insufficient dielectric strength of coil insulation of an electric machine. The apparatus comprises a capacitive measurement bridge wherein the conductor coils are connected to a measuring leg thereof. Following balancing of the bridge, predetermined threshold amplitudes of current impulses are measured after being passed through a narrow band frequency selection means. The current impulses due to partial discharges in the insulation of the coils are thus measured and the voltage applied to the coils is varied to provide measurements over a range of voltage values. A maximum voltage peak occurring in the range of voltages about the service voltage of the machine is indicative of insufficient dielectric strength of the coil insulation.

13 Claims, 4 Drawing Figures

METHOD FOR THE DETECTION OF INSUFFICIENT DIELECTRIC STRENGTH OF COIL INSULATION

BACKGROUND OF THE INVENTION

The problem of determining the quality of coil insulation in high voltage electric machines has been in existence for a long time. Generally, the causes of deterioration of the coil insulation cannot be attributed to a single condition. In practice, it has thus been necessary to follow an expensive procedure of rewinding machines otherwise in perfect condition, since no methods were reliable to ensure detection of an imminent penetration of the insulation of the machine.

Due to an improved understanding of the deterioration phenomenon, it has been recognized that the insufficient strength of the insulation of apparently sound coils is caused by the generation of localized partial discharges inside the insulation, which appear above a certain voltage threshold. However, this information did not solve the problem, because the localized partial discharges inside the insulation escape direct measurement.

According to the generally accepted conventional view, the partial discharges localized inside the insulation take place at gaseous occlusions distributed in vacuoles more or less over all of the high voltage insulation. At certain voltages, partial discharges are generated inside a rising number of vacuoles, or cavities. The capacity of the coils varies as a function of the applied voltage, as the inside of these vacuoles, becomes conducting. In view of these findings, for example Terase (Electr. Eng. Jap., February 1973) has proposed a quality criterion based on the variation of the capacity curve of coils as a function of the applied voltage. This characteristic may be determined by means of a capacity measuring bridge, for example a Schering bridge. The Terase method in certain cases is capable of yielding valuable information. In numerous other cases, however, the precision with which the characteristics essential for interpretation of the data is inadequate. In still other cases, the effects investigated are completely masked by other phenomena.

SUMMARY OF THE INVENTION

It is the object of the invention to provide an extremely sensitive method of detection that may be effected by means of existing measuring apparatuses and which yields significant evaluation criteria on a physical level, based on harmful partial discharges.

According to the invention, the method of the detection of an insufficient dielectric strength of the coil insulation of an electric machine, wherein in the measuring branch of a capacity measuring bridge, on the one hand the conductors of the coils and on the other, the parts of the mass of the machine disposed around the coils, are connected and wherein the measuring bridge is balanced for each alternative measuring voltage taken from a given series of voltages, the frequency of the alternating voltage being chosen from among the frequencies appearing on the coils under the conditions wherein the machine is used, is characterized in that after each balancing in the balancing diagonal of the measuring bridge the device indicating the balance is replaced by a highly selective instrument to measure the current impulses of predetermined amplitude due to the partial discharges, letting pass a frequency corresponding to the train of waves of the mean current of local partial discharges inside the coil insulation, and in that values of the measuring voltage are scanned between a voltage value lower than the service voltage of the machine and a value equal to or higher than the maximum permissible voltage of the machine. Preferably, the values of the amplitude and/or the frequency of the appearance of the impulses measured by the high selectivity measuring instrument are recorded as a function of the applied voltage, and the danger of an insufficient strength of the coil insulation of the machine is evaluated from the maxima of these values in the vicinity of the service voltage of the machine.

BRIEF DESCRIPTION OF THE DRAWINGS

The invention is described hereinbelow with reference to the drawings wherein.

DETAILED DESCRIPTION OF THE PREFERRED EMBODIMENT

Figure 1:
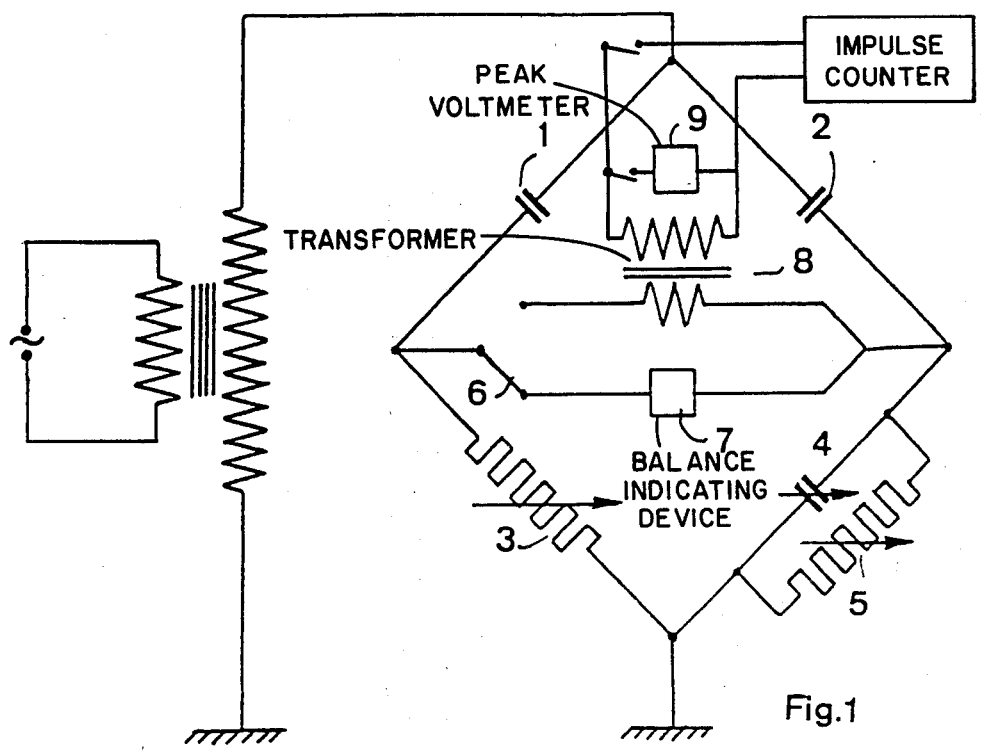
FIGS. 1 and 2 show the electrical diagrams of the measuring bridges.

In FIG. 1, a measuring bridge consists of four branches and a balancing diagonal. The four branches comprise (a) a capacitor to be measured 1, consisting here of the capacity of the static winding of a motor with respect to its mass, (b) a reference capacitor 2, (c) a balancing resistance 3, and (d) a balancing capacitor 4 placed in parallel with a variable resistance 5. A switch 6 is placed in the measuring diagonal, connected with either a balance indicating device 7, or a high frequency, saturable transformer 8 with a ferrite core, the secondary winding thereof supplying a peak voltmeter 9. In place of the switch 6, it is possible to connect the transformer 8 permanently in the measuring diagonal and to place a low pass filter in series with the balance device 7. The assembly of the transformer 8 and the voltmeter 9 may be replaced by any peak amplitude measuring device, i.e., any other device to measure with high selectivity the largest amplitude of the current impulses due to the partial discharges. The current impulses with the highest amplitude are the harmful impulses.

Figure 2:
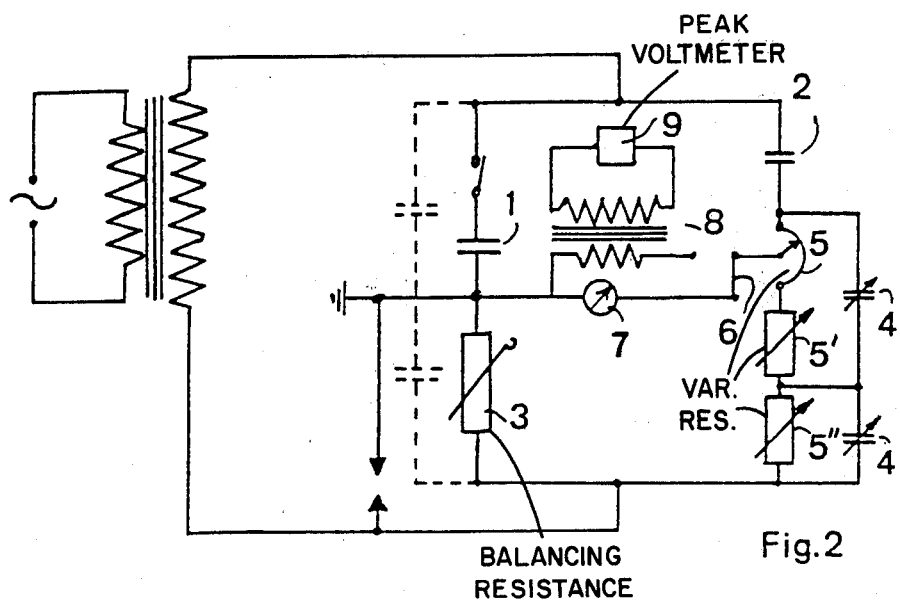

The measurement is effected as follows: the bridge is balanced with the aid of the device 7 with a frequency of 50 Hz initially for each measuring voltage of a range around the nominal voltage of the motor. By this means, the capacity of the static winding of the motor is measured with respect to the mass of the motor. Under the feed conditions shown in FIG. 1, the stator mass of the motor must be insulated from the ground. If the capacity of the stator winding of a grounded machine is to be measured, either the bridge must be supplied through the branches or the bridging arrangement according to FIG. 2 may be used.

Figure 3:
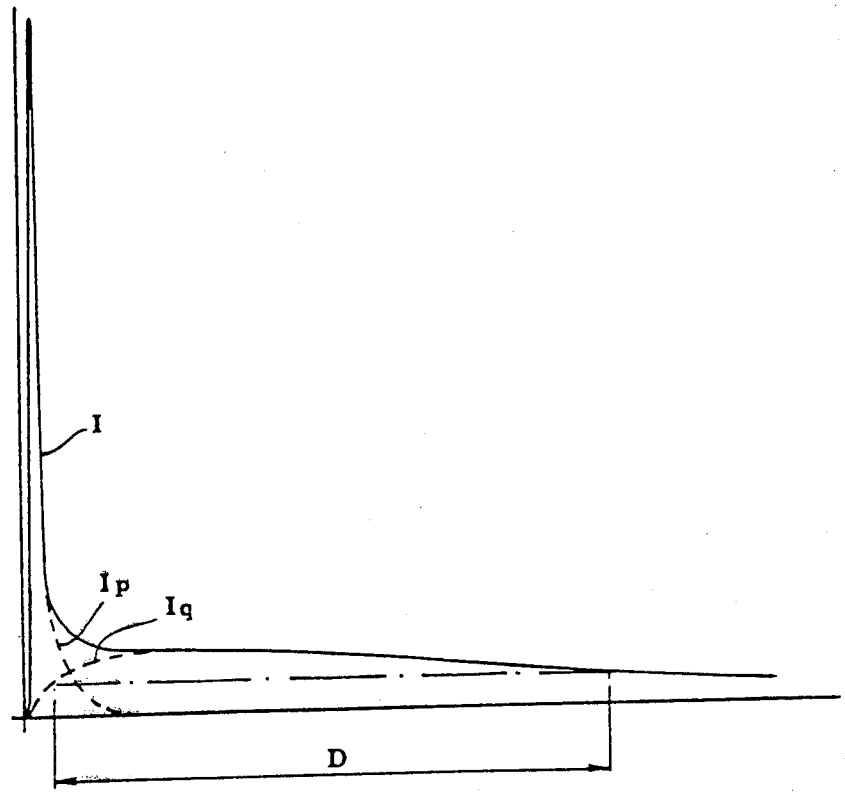
FIG. 3 shows the form of a mean impulse of a partial discharge.

When the equilibrium of the bridge is established, the position of the moving contact of the switch 6 is changed to eliminate the balance indicating device 7 from the circuit and to insert into the measuring diagonal of the transformer 8. The transformer 8 is a transformer with a high selectivity for a frequency f corresponding approximately to the inverse of the duration D of the train of a mean impulse 1 of the partial, local discharges. In FIG. 3, the impulse 1 is resolved into two components $1_p$ responsible for the peak and $1_q$ responsible for the train. It may be seen that the component $1_q$, while of a low amplitude, is of a very long duration and thus contributes more to the destructive effects on the insulation than the component $1_p$ which is of extremely short duration. The duration D of the train is the duration of the impulse $1_q$ at mid-height of the peak of said component $1_q$. The band-pass of the assembly of the transformer 8 and the peak voltmeter 9 is preferably very narrow around the frequency $f=1/2D$. It is chosen so that it is possible to eliminate the component $1_p$, together with the parasitic impulses of any sort.

By selecting the transformer 8 having a predetermined frequency selectivity, the measuring apparatus is sensitive to mean impulses the duration D corresponding to the inverse of the frequency f. The form of the mean impulse of the local partial discharges may vary with the applied voltage and may further vary from insulation to insulation. The variation as a function of voltage is the most important. For ease of measurement of the partial discharges, the product of the capacity of the reference capacitor times the value of the resistance of the balancing resistance must be equal to a time shorter than the duration D of the mean impulse. It is possible thereby to eliminate from the measurements the effect of the high leading peaks of the impulses. These peaks or components $1_p$ represent the energy necessary to produce charges inside the insulation, which in itself is not harmful. What is harmful, is the dynamic evacuation or elimination of these charges represented by the component $1_q$. The high selectivity of the transformer 8 makes it possible to determine the value of the measuring voltage for which the mean discharge impulse has a duration D, because at this voltage value, the curve representing the values measured by the peak voltmeter 9 as a function of the measuring voltages has a relative maximum. If, in contrast, the measured curve has no maximum, it must be concluded that other phenomena connected with partial local discharges at the site of vacuoles are manifested, not involving the degradation of insulation. The insulation may then be considered sound.

The transformer 8 is a saturable transformer, saturation occurring when the quantity of the charges passing through the primary of the transformer exceeds a threshold located above a value compatible with the phenomenon of local partial discharges. If this threshold is exceeded, the phenomenon recorded no longer has anything to do with the local partial discharges (example: superficial discharges).

It is also possible to replace the peak voltmeter 9 with a counter to count the harmful impulses. The harmfulness of an impulsion may be determined by its intensity and by its frequency. If such an impulsion appears at each alternation of the frequency of the alternating measuring voltage, a permanent phenomenon is involved which over a longer or shorter time of occurrence will destroy the insulation. In contrast, if for example the frequency of the appearance of harmful impulses is below a factor of 0.5 of the alternation rate of the alternating voltage of the measurement, the appearance of such impulses may be considered erratic and not leading to the destruction of the insulation over the short term.

In order to effect this counting procedure the counter has an inlet threshold stage, preferably adjustable, which admits only impulses of an intensity higher than a set threshold. Furthermore, the sampling period of the counter is chosen preferably between 50 and 1000 alternances of the frequency of the measuring voltage. It is recommended to remain below 1000 alternances so that the measuring time will not be extended unnecessarily. The minimum of 50 alternances must be observed in order to reduce the influence of the noise originating by the parasitic impulses generated in the network, for example during the closing and opening of breakers.

The measuring procedure may consist of the choice of a single threshold intensity value for the entire measuring range or of a series of several settings of different thresholds for each measuring voltage, or of a single threshold intensity for each measuring voltage, chosen as a function of the measuring voltage, for example proportional to the measuring voltage.

A particularly advantageous measuring method results from a combination of measurements utilizing the peak voltmeter and the impulse counter. In this case, an impulse counter with an input threshold stage is connected in parallel with the peak voltmeter 9. The threshold of the impulse counter is set, either manually or automatically, equal to a voltage slightly lower than the amplitude of the largest impulse applied to the peak voltmeter, for example at a value between 98% and 80% of the amplitude of pulse $I_q$. The comparison of the measurements recorded by the peak voltmeter, and the impulse counter, makes it possible to interpret the measurement results with a high degree of confidence as to the cause of the destruction of the insulation of the coils of the machines tested.

The advantages of the measuring process described hereinbove are not restricted to the detection of internal discharges. But this detection of internal charges is facilitated even in the presence of discharges of a different nature, such as superficial discharges i.e., parallel to the outer surface of the insulation, outside of the slots, or slot discharges i.e., perpendicular to the outer surface of the insulation, inside of the slots, because of the selectivity of the measuring process according to the invention for internal discharges. However, beginning with a certain level of the measuring voltage, the superficial and/or slot discharges mask the detection of internal discharges. This is not a problem in practice since it is only important to determine whether the insulation is good or bad. In fact, insulation which is in good condition cannot exhibit superficial discharges or slot discharges below the service voltage or even immediately above the service voltage.

Further, it is possible to determine whether an increase in the values measured by the peak voltmeter 9 is the result of internal discharges or of superficial or slot discharges. In effect, if superficial discharges are involved, the increase in the values measured by the peak voltmeter 9 as a function of the measuring voltage suddenly becomes much larger than normal. Further, the operator may simultaneously sense the odor of ozone and may hear the noise generated by the superficial discharges. If the operator slightly delays each measurement, the frequency of the appearance of the superficial discharges particularly at high voltages will drop in less than a minute from for example 1 discharge per alternance to 1 discharge per 50 alternances.

In the case of the appearance of slot discharges, no noise is heard and no ozone odor is perceived. By virtue of these ancillary manifestations, it is possible to clarify a range of characteristic phenomena which may contribute to the evaluation of the dielectric quality of the insulation of an electric machine.

Figure 4:
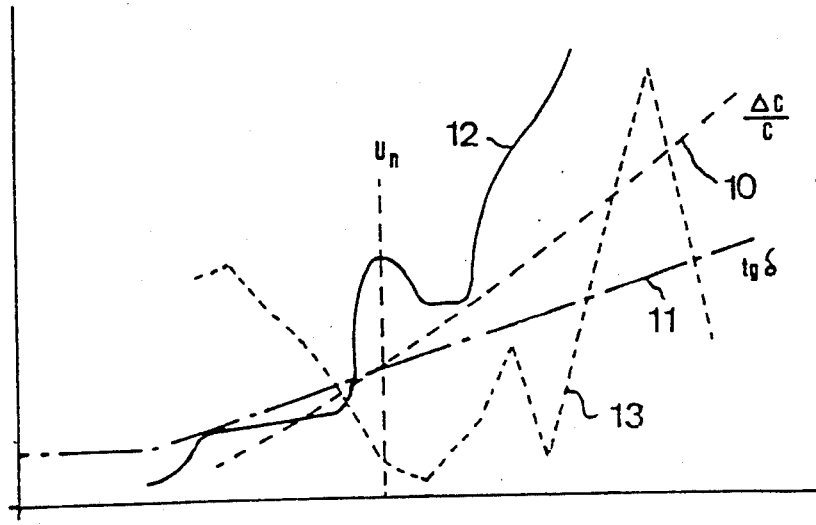
FIG. 4 illustrates graphic results obtained from measurements taken in practicing the invention.

FIG. 4 shows several superposed diagrams of measurements effected by the installation according to the invention. For all of the curves, the measuring voltage is plotted on the abcissa, while values of different magnitude are plotted on the ordinate. The values represented by the different curves are the following. Curve 10 is the relative increase of coil capacity with respect to the machine mass. Curve 11 is the tgα of the insulation. Curve 12 is the value measured by the peak voltmeter 9. Curve 13 is the number of discharges per alternance counted by the counter of the harmful impulses. While Curves 10 and 11 show no event involving the insulation, the same is not true for Curves 12 and 13. At voltages appreciably below the nominal voltage $U_n$ of the electric machine measured, numerous low amplitude internal discharges are measured by the peak voltmeter and they appear at nearly every alternance. However, as a function of the measuring voltage, discharges of higher amplitudes are produced and measured by the peak voltmeter and recorded by the counter. This explains the decreasing trend of Curve 13. However, the maximum amplitude of the discharges measured by the peak voltmeter 9 passes through a maximum relative to the location of the nominal voltage. Slightly above the nominal voltage Curve 12 shows a shoulder from which a rising branch due to superficial charges is departing. Beginning with the measuring voltage corresponding to the shoulder, the operator senses the characteristic odor of ozone, confirming the involvement of superficial discharges. The frequency of the appearance of these discharges measured by the counter shows two maxima which are indications of the fact that beginning with certain high voltages, some of the weak points producing superficial discharges are burnt and eliminated. An insulation producing the curves according to FIG. 4 should therefore be considered relatively good, because the most harmful internal discharges only exhibit an erratic character, and superficial discharges appear only at measuring voltages appreciably higher than the normal voltage of the machine. However, the fact that the maximum of Curve 12 is located at the point of the nominal voltage indicates that the insulation should be investigated within a relatively short period of time.

I claim:

1. Apparatus for detecting a dielectric characteristic of coil insulation of an electric machine comprising:
   (a) a bridge network having a diagonal branch and four legs including a measurement leg,
   (b) said coils and electric machine mass adjacent said coils being connected in said measurement leg,
   (c) means disposed in at least one of said legs for balancing said bridge,
   (d) current balance detection means disposed in said diagonal branch for detecting balance of said bridge,
   (e) means for applying an AC voltage to said bridge, the frequency of said voltage selected from the range of frequencies appearing on said coils during operation of said machine,
   (f) means in said diagonal branch of said bridge for measuring current impulses of predetermined amplitude and within a predetermined frequency band,
   (g) means for adjusting the AC voltage magnitude to scan a predetermined range of voltages between a minimum and maximum value, and
   (h) said current impulse measuring means operative for effecting measurements as a function of a plurality of AC voltages within said predetermined range
   whereby said measuring means measures the current impulses having a frequency corresponding to the mean current, $I_q$, of local partial discharges inside said coil insulation while said measuring voltages vary within said range between said minimum corresponding to a lower value of the nominal service voltage of said machine and a maximum corresponding to a value equal to or larger than the maximum permissible voltage of said machine.

2. Apparatus as recited in claim 1 further comprising: resistor and capacitor means connected in legs of said bridge, and
switch means for alternately connecting in said diagonal branch one of said balance detection means and said measuring means.

3. Apparatus as recited in claim 2, wherein said measuring means comprises a transformer having a narrow frequency band selectivity.

4. Apparatus as recited in claim 3, wherein said transformer is a saturable transformer.

5. Apparatus as recited in claim 1 or 3, wherein said measuring means comprises a voltmeter for measuring the peak amplitude of said current impulses.

6. Apparatus as recited in claim 1, wherein said measuring means comprises a counter and said apparatus further comprises a threshold device for passing pulses only above a predetermined threshold to said counter.

7. Apparatus as recited in claim 6, wherein the sampling period of said measuring means is between 50 and 1000 alternances of the frequency of said AC voltage.

8. Apparatus as recited in claim 6, wherein said means for measuring comprises a peak voltmeter connected in parallel with a series connection of said counter and threshold device.

9. Apparatus as recited in claim 8 further comprising means for varying the threshold of said threshold device.

10. A method for detecting the quality of coil insulation of an electric machine comprising the steps of:
   (a) connecting the coils and electric machine mass adjacent said coils in a measurement leg of a bridge network having a diagonal balancing branch and at least one balancing leg,
   (b) connecting an AC voltage to said bridge, the frequency of said AC voltage being selected from the range of frequencies appearing on said coils during normal operation of said machine,
   (c) balancing said bridge by varying impedance elements within said at least one balancing leg,
   (d) measuring current pulses by measuring means in said diagonal balancing branch, said measuring means being sensitive to current pulses of predetermined amplitudes and within at least one predetermined frequency band outside the said frequencies appearing during normal operation of said machine,
   (e) adjusting the AC voltage magnitude to scan a predetermined range of voltages between a minimum and a maximum value, and
   (f) providing an indication of the current pulses measured by said measuring means for different values of said AC voltages between said minimum and maximum values.

11. A method as recited in claim 10 wherein the step of adjusting the AC voltage magnitude includes varying the voltage magnitude between a minimum value less than the normal operating voltage of the machine and a maximum value at least equal to the normal operating voltage of said machine.

12. A method for detecting the quality of coil insulation of an electric machine comprising the steps of:
(a) connecting the coils and electric machine mass adjacent said coils in a measurement leg of a bridge network having a diagonal balancing branch and at least one balancing leg,
(b) connecting an AC voltage to said bridge, the frequency of said AC voltage being selected from the range of frequencies appearing on said coils during normal operation of said machine,
(c) balancing said bridge by varying impedance elements within said at least one balancing leg,
(d) measuring current pulses by measuring means in said diagonal balancing branch, said measuring means being sensitive to current pulses of predetermined amplitudes and within a narrow frequency band corresponding to the current pulses of local partial discharges inside the coil insulation,
(e) adjusting the AC voltage magnitude to scan a predetermined range of voltages between a minimum and a maximum value, and
(f) providing an indication of the current pulses measured by said measuring means for different values of said AC voltages between said minimum and maximum values.

13. A method as recited in claim 12 wherein the step of adjusting the AC voltage magnitude includes varying the voltage magnitude between a minimum value less than the normal operating voltage of the machine and a maximum value at least equal to the normal operating voltage of said machine.

* * * * *